(12) United States Patent
Harada

(10) Patent No.: US 6,673,180 B2
(45) Date of Patent: Jan. 6, 2004

(54) MULTILAYERED CERAMIC SUBSTRATE PRODUCTION METHOD

(75) Inventor: Hideyuki Harada, Omihachiman (JP)

(73) Assignee: Murata Manufacturing Co., Ltd., Kyoto-fu (JP)

( * ) Notice: Subject to any disclaimer, the term of this patent is extended or adjusted under 35 U.S.C. 154(b) by 79 days.

(21) Appl. No.: 10/093,033

(22) Filed: Mar. 8, 2002

(65) Prior Publication Data

US 2002/0140135 A1 Oct. 3, 2002

(30) Foreign Application Priority Data

Mar. 28, 2001 (JP) ......................................... 2001-091604

(51) Int. Cl.⁷ ............................................... C03B 29/00
(52) U.S. Cl. .................................. 156/89.11; 156/89.12
(58) Field of Search ........................... 156/89.11, 89.12; 264/614, 619

(56) References Cited

U.S. PATENT DOCUMENTS

2001/0022416 A1 * 9/2001 Harada et al.

FOREIGN PATENT DOCUMENTS

| JP | 05-167253 A1 | 7/1993 |
| JP | 06-329476 A1 | 11/1994 |
| JP | 11-177238 A1 | 7/1999 |
| JP | 2000-332147 A1 | 11/2000 |

* cited by examiner

*Primary Examiner*—Christopher A. Fiorilla
(74) *Attorney, Agent, or Firm*—Dickstein, Shapiro, Morin & Oshinsky, LLP.

(57) ABSTRACT

A green sheet stack having a cavity is produced, and a shrinkage-reducing sheet containing inorganic powder material, which is not fired in a step of firing the green sheet stack, is prepared. The shrinkage-reducing sheet is placed so as to close an aperture of the cavity and to cover an end face in the sheet-stacking direction of the green sheet stack. The green sheet stack is pressed via an elastic member in the sheet-stacking direction so that the shrinkage-reducing sheet is cut and a shrinkage-reducing sheet piece formed of a cut portion of the shrinkage-reducing sheet is placed on a bottom surface of the cavity. The green sheet stack is fired in such a state in which the shrinkage-reducing sheet piece is placed on the bottom surface of the cavity.

20 Claims, 3 Drawing Sheets

MULTILAYERED CERAMIC SUBSTRATE PRODUCTION METHOD

BACKGROUND OF THE INVENTION

1. Field of the Invention

The present invention relates to a multilayered ceramic substrate production method, and more particularly, to a production method for a multilayered ceramic substrate having a cavity for mounting and holding an electronic component therein.

2. Description of the Related Art

In recent years, there has been an increasing demand for smaller and lighter electronic components with more functions, higher reliability, and the like. Consequently, there has been a need to improve the technique for mounting components on a substrate. The most typical and effective method for improving the mounting technique on the substrate is to increase the density of wiring on substrates.

In order to respond to such a desired increase in density of wiring of the substrates, multilayered ceramic substrates produced by stacking a plurality of green ceramic sheets having conductive films and the like printed thereon, and by pressing and firing the green ceramic sheets, have been developed.

In order to reduce the size and thickness of the multilayered ceramic substrate itself, it is effective to form, in the multilayered ceramic substrate, a cavity for mounting an electronic component therein.

In such a multilayered ceramic substrate having a cavity, however, the flatness of the bottom surface of the cavity is often degraded as a result of a firing step conducted during the process of obtaining the multilayered ceramic substrate. This tendency is marked particularly when the cavity has a step portion therein. As the number of such step portions increases, the problem worsens.

A so-called shrinkage-reducing process is frequently adopted in the firing step for producing the multilayered ceramic substrate. That is, the firing step in the multilayered ceramic substrate production method using the shrinkage-reducing process is performed in a state in which shrinkage-reducing layers containing an inorganic powder material, which is not fired at the firing temperature of a ceramic material contained in the plurality of green ceramic sheets, are placed so as to cover both end faces in the sheet-stacking direction of a green sheet stack formed by stacking the green ceramic sheets. In such a shrinkage-reducing process, the shrinkage-reducing layers are not substantially shrunk in the principal surface direction during the firing step, and the green ceramic sheets are thereby restrained. Therefore, the obtained multilayered ceramic substrate is not prone to nonuniform deformation. This makes it possible to reduce undesirable deformation and distortion in wiring conductors disposed in connection with the multilayered ceramic substrate, and to thereby advantageously increase the density of wiring conductors.

In the multilayered ceramic substrate having a cavity, however, it is difficult to exert the restraining action of the shrinkage-reducing layer onto the bottom surface of the cavity, and the above-described problem of degradation in flatness of the bottom surface of the cavity is often not overcome by simply adopting the shrinkage-reducing process. Moreover, the degradation in flatness of the bottom surface of the cavity is more considerable when undesirable deformation of the portion of the multilayered ceramic substrate other than the cavity is inhibited.

In order to overcome the above problems, for example, Japanese Unexamined Patent Application Publication No. 5-167253 or No. 11-177238 discloses that a firing step is performed while the interior of a cavity is filled with an inorganic material powder, which is not fired at the firing temperature of a ceramic material contained in green ceramic sheets or with a paste containing the inorganic material powder. In this method, however, a difference in shrinking behavior in the sheet-stacking direction is made between the green ceramic sheets and the inorganic material powder in the cavity during firing. For this reason, the periphery of the cavity is prone to cracking. This problem is more serious particularly when the cavity has a step portion therein, and as the number of such step portions increases.

SUMMARY OF THE INVENTION

Accordingly, it is an object of the present invention to provide a production method for a multilayered ceramic substrate having a cavity which can overcome the above-described problems.

The present invention relates to a multilayered ceramic substrate production method including the steps of: preparing a first green ceramic sheet having an opening for forming a cavity, and a second green ceramic sheet having no opening at least at a position corresponding to the opening; producing a green sheet stack having a cavity defined by the opening by stacking the first green ceramic sheet and the second green ceramic sheet so that an aperture of the cavity is placed on at least one end face in the sheet-stacking direction of the green sheet stack; pressing the green sheet stack in the sheet-stacking direction; and firing the green sheet stack at a temperature at which a ceramic material contained in the first and second green ceramic sheets is fired. In order to solve the above technical problems, the multilayered ceramic substrate production method of the present invention includes the following structures.

The multilayered ceramic substrate of the present invention further includes a step of preparing a shrinkage-reducing sheet containing an inorganic material powder which is not fired in the step of firing the green sheet stack.

In the step of producing the green sheet stack, the shrinkage-reducing sheet is placed so as to close the aperture of the cavity and to cover the end face in the sheet-stacking direction of the green sheet stack.

The step of pressing the green sheet stack is performed so that a pressing force is exerted onto a bottom surface of the cavity, so that the shrinkage-reducing sheet is cut along the rim which defines the aperture of the cavity, and so that a shrinkage-reducing sheet piece formed of a part of the shrinkage-reducing sheet is placed on the bottom surface of the cavity.

As a result, the step of firing the green sheet stack is performed in a state in which the shrinkage-reducing sheet piece is placed on the bottom surface of the cavity.

Preferably, the shrinkage-reducing sheet piece is removed after the green sheet stack is fired.

Preferably, the step of pressing the green sheet stack is performed so that the green sheet stack is pressed via an elastic member placed outside the shrinkage-reducing sheet.

Preferably, a rigid plate having an opening of a size substantially equal to or slightly smaller than that of the aperture of the cavity is prepared, and the step of pressing the green sheet stack is performed in a state in which the rigid plate is placed between the elastic member and the green sheet stack. The rigid plate may be placed between the shrinkage-reducing sheet and the elastic member, or between the green sheet stack and the shrinkage-reducing sheet.

Preferably, the shrinkage-reducing sheet is placed in contact with the end face in the sheet-stacking direction of the green sheet stack in the step of producing the green sheet stack, and the step of firing the green sheet stack is performed in a state in which a portion of the shrinkage reducing sheet remaining after the shrinkage-reducing sheet piece is removed from the shrinkage-reducing sheet remains on the end face in the sheet-stacking direction of the green sheet stack.

Preferably, when the cavity is formed on only one end face in the sheet-stacking direction of the green sheet stack, a second inorganic material powder, which is not fired during the step of firing the green sheet stack, is prepared, and a shrinkage-reducing layer containing the second inorganic material powder is placed so as to cover an end face of the green sheet stack opposite from the end face with the cavity when the green sheet stack is produced.

A second inorganic material powder which is not fired in the step of firing the green sheet stack may be prepared, and a shrinkage-reducing layer containing the second inorganic material powder and having a portion from which the aperture of the cavity is exposed, may be placed so as to cover the end face in the sheet-stacking direction of the green sheet stack in the step of producing the green sheet stack.

Preferably, the second inorganic material powder is the same as the inorganic material powder contained in the shrinkage-reducing sheet.

Preferably, the shrinkage-reducing layer is removed after the green sheet stack is fired.

The present invention is advantageously applied particularly to a case in which the cavity has therein at least one step portion which defines an aperture smaller than the above aperture. In this case, the shrinkage-reducing sheet is also cut along the rim of the step portion as a result of the step of pressing the green sheet stack, and a shrinkage-reducing sheet piece is also placed on a bottom surface formed on the step portion.

The shrinkage-reducing sheet may be subjected beforehand to processing which allows the shrinkage-reducing sheet to be easily cut at a specific portion. Preferably, perforations are formed beforehand in a specific portion of the shrinkage-reducing sheet.

Further objects, features, and advantages of the present invention will become apparent from the following description of the preferred embodiments with reference to the attached drawings.

DESCRIPTION OF THE PREFERRED EMBODIMENTS

Figure 1A:
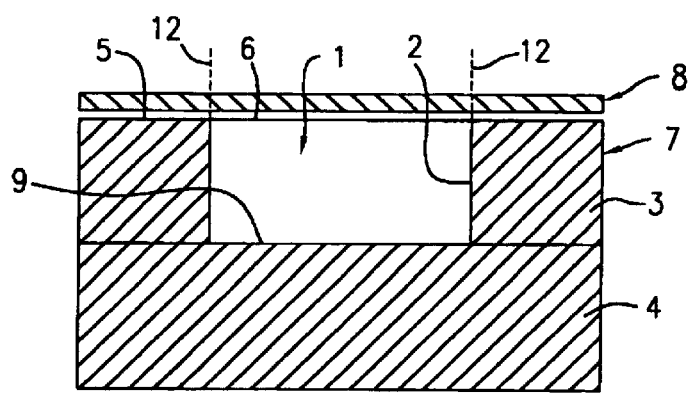
FIGS. 1A to 1C are sectional views sequentially illustrating typical steps included in a multilayered ceramic substrate production method according to a first embodiment of the present invention.
Figure 1B:
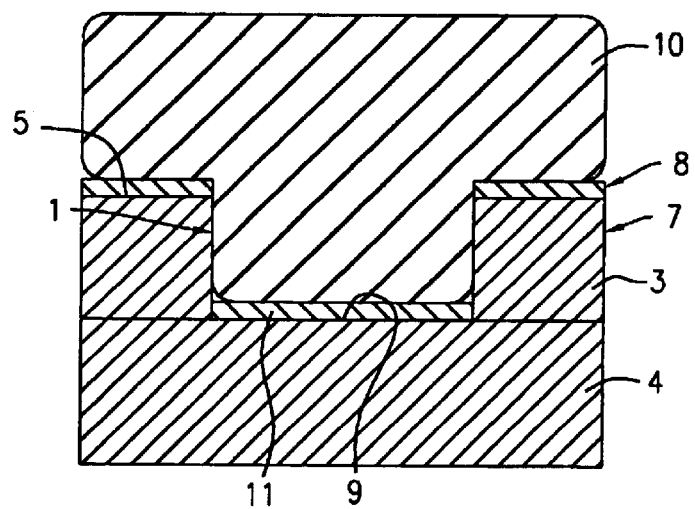
Figure 1C:
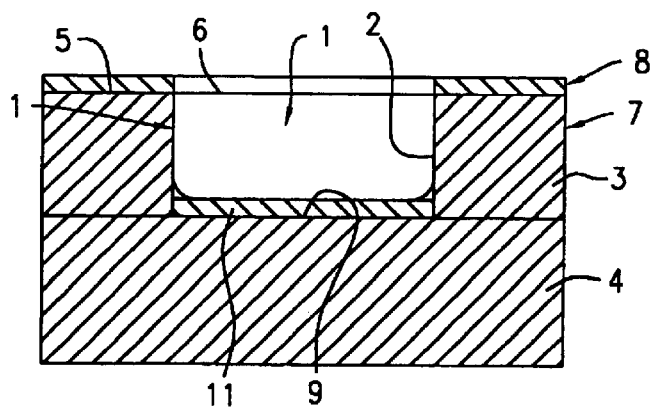

FIGS. 1A to 1C sequentially show typical steps included in a multilayered ceramic substrate production method according to a first embodiment of the present invention.

As shown in FIG. 1A, a first green ceramic sheet 3 having an opening 2 which forms a cavity 1 is prepared, and a second green ceramic sheet 4 which does not have an opening at least at a position corresponding to the opening 2, that is, which has no opening in this embodiment, is prepared.

The first and second green ceramic sheets 3 and 4 are formed by shaping a slurry, which is produced by dispersing ceramic powder in an organic vehicle containing an organic binder and an organic solvent, into a sheet by the doctor blade method or other methods, as is well known.

Subsequently, a green sheet stack 7 is produced by stacking the first green ceramic sheet 3 and the second green ceramic sheet 4. The green sheet stack 7 has a cavity 1 which is defined by the opening 2 so that an aperture 6 is positioned on at least one end face in the sheet-stacking direction, that is, on one end face 5 in the sheet-stacking direction in this embodiment.

In FIGS. 1A to 1C, conductive films and wiring conductors, such as via-hole conductors, which are necessary for the multilayered ceramic substrate to be obtained, are not shown. While each of the first and second green ceramic sheets 3 and 4 is shown as a single structure shown in FIGS. 1A to 1C, each are often composed of a plurality of stacked green ceramic sheets.

As is similarly shown in FIG. 1A, a shrinkage-reducing sheet 8 containing an inorganic material powder which is not fired at the firing temperature of a ceramic material contained in the green ceramic sheets 3 and 4 is prepared. In the above-described step of producing the green sheet stack 7, the shrinkage-reducing sheet 8 is placed so as to close the aperture 6 of the cavity 1 to cover the end face 5 in the sheet-stacking direction of the green sheet stack 7.

In order to make a difference in firing temperature, as described above, it is preferable that the ceramic material contained in the green ceramic sheets 3 and 4 contain a glass component. The inorganic material powder contained in the shrinkage-reducing sheet 8 is, for example, alumina powder.

The shrinkage-reducing sheet 8 can be produced by shaping a paste, which is obtained by dispersing the above inorganic material powder in an organic vehicle containing an organic binder and an organic solvent, into a sheet by the doctor blade method or other methods.

Next, a step of pressing the green sheet stack 7 in the sheet-stacking direction is performed, as shown in FIG. 1B. In this step, pressing is done so that a pressing force is exerted onto a bottom surface 9 of the cavity 1. For that purpose, an elastic member 10 is placed outside the shrinkage-reducing sheet 8 in this embodiment, and the green sheet stack 7 is pressed via the elastic member 10.

As shown in FIG. 1B, the elastic member 10 deforms so as to enter the cavity 1 during the pressing step, and exerts the pressing force onto the bottom surface 9 of the cavity 1. Therefore, the pressing force can be exerted on the entire green sheet stack 7.

As a result of the pressing force, the shrinkage-reducing sheet 8 is cut along the rim of the cavity 1 which defines the aperture 6. A shrinkage-reducing sheet piece 11 formed of a part of the shrinkage-reducing sheet 8 is placed on the bottom surface 9 of the cavity 1 so that it is in close contact therewith, as shown in FIG. 1B.

While the above pressing step may be performed by rigid pressing, it is more preferably performed by hydrostatic pressing. In the case of the hydrostatic pressing, the green sheet stack 7, the shrinkage-reducing sheet 8 and the elastic member 10 are vacuum-packed in a bag (not shown), and a hydrostatic pressure is applied thereto in this state.

Since the shrinkage-reducing sheet 8 is obtained by shaping a paste, which is obtained by dispersing inorganic material powder in an organic vehicle, into a sheet, it can be easily cut along the rim of the aperture 6 of the cavity 1.

The shrinkage-reducing sheet 8 may be subjected beforehand to processing which makes such cutting at a specific position easier, as necessary. For example, by forming perforations at a position of the shrinkage-reducing sheet 8 corresponding to the rim of the aperture 6, that is, at a position shown by dotted lines 12 in FIG. 1A, the shrinkage-reducing sheet 8 can be easily cut along the perforations. Instead of the perforations, a V-groove may be formed on the shrinkage-reducing sheet 8.

By thus subjecting the shrinkage-reducing sheet 8 beforehand to the processing which makes the cutting at the specific position easier, it is possible not only to easily cut the shrinkage-reducing sheet 8 at the specific position, but also to stably fix the cutting position.

In order to easily cut the shrinkage-reducing sheet 8 at a specific position, for example, the elastic member 10 may be provided with a portion shaped like a knife edge, instead of processing the shrinkage-reducing sheet 8.

FIG. 1C shows a state after the above pressing step is completed. In this state, the green sheet stack 7 is fired. In this firing, the remaining portion of the shrinkage-reducing sheet 8 is placed on the end face 5 of the green sheet stack 7, and the shrinkage-reducing sheet piece 11 is placed on the bottom surface 9 of the cavity 1. Since the remaining portion of the shrinkage-reducing sheet 8 and the shrinkage-reducing sheet piece 11 are not fired in the firing step, they are not substantially shrunk. This makes it possible to effectively reduce the shrinkage of the green sheet stack 7 in the principal-surface direction, and, particularly, to reliably maintain the flatness of the bottom surface 9 of the cavity 1.

After such a firing step is completed, the remaining portion of the shrinkage-reducing sheet 8 and the shrinkage-reducing sheet piece 11 are removed. Since the remaining portion of the shrinkage-reducing sheet 8 and the shrinkage-reducing sheet piece 11 are unfired, they are easily removed.

Next, a conductive film is formed on the outer surface, as necessary, an electronic component (not shown) is inserted in the cavity 1 and an electric connection is established, thereby completing a multilayered ceramic substrate.

Figure 2A:
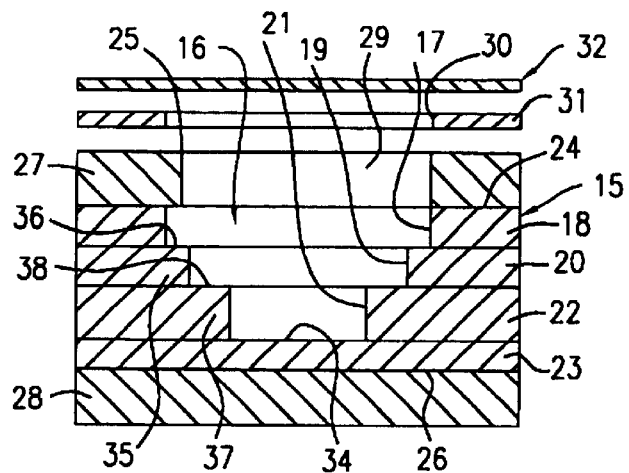
FIGS. 2A to 2C are sectional views sequentially illustrating typical steps included in a multilayered ceramic substrate production method according to a second embodiment of the present invention.
Figure 2B:
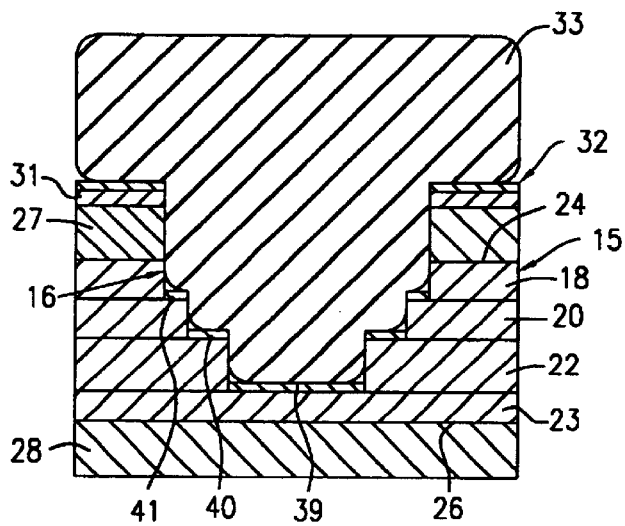
Figure 2C:
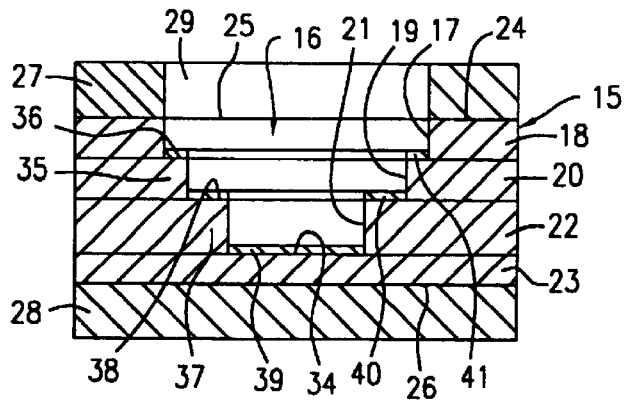

FIGS. 2A to 2C sequentially show typical steps included in a multilayered ceramic substrate production method according to a second embodiment of the present invention.

The second embodiment shown in FIGS. 2A to 2C is significantly different from the first embodiment shown in FIGS. 1 to 1C in that a so-called shrinkage-reducing process is adopted and in that a plurality of step portions are formed inside the cavity.

First, a green sheet stack 15 is produced, as shown in FIG. 2A. In order to produce the green sheet stack 15, a first green ceramic sheet 18 having an opening 17 which constitutes a cavity 16, a second green ceramic sheet 20 having a smaller opening 19 which similarly constitutes the cavity 16 and a third green ceramic sheet 22 having a still smaller opening 21 which similarly constitutes the cavity 16 are prepared, and a fourth green ceramic sheet 23 having no opening is also prepared.

Each of the green ceramic sheets 18, 20, 22 and 23 may be a structure in which a plurality of green ceramic sheets are stacked.

The green ceramic sheets 18, 20, 22 and 23 are stacked, and cavity 16 is thereby formed so that an aperture 25 thereof is placed on one end face 24 in the sheet-stacking direction of the green sheet stack 15.

An organic material powder which is not fired at the firing temperature of a ceramic material contained in the green ceramic sheets 18, 20, 22 and 23, that is, which is not fired during the firing the green sheet stack 15, is prepared. Shrinkage-reducing layers 27 and 28 containing the inorganic material powder are formed so as to cover the end faces 24 and 26 in the sheet-stacking direction of the green sheet stack 15.

The shrinkage-reducing layers 27 and 28 can be produced by stacking, on the end faces 24 and 26 of the green sheet stack 15, sheets which are formed by shaping a paste obtained by dispersing the above inorganic material powder in an organic vehicle. One of the shrinkage-reducing layers 27 has a through portion 29 from which the aperture 25 of the cavity 16 is exposed.

The inorganic material powder contained in the shrinkage-reducing layers 27 and 28 is, for example, alumina powder.

As an example, the green sheet stack 15 has a plane size of 100 mm×100 mm, and a thickness of 1 mm. The cavity 16 has a plane size of 3 mm×3 mm and a thickness of 150 $\mu$m at the portion defined by the opening 17, a plane size of 2 mm×2 mm and a thickness of 200 $\mu$m at the portion defined by the opening 19, and a plane size of 1.5 mm×1.5 mm and a thickness of 200 $\mu$m at the portion defined by the opening 21. The shrinkage-reducing layers 27 and 28 have a thickness of 300 $\mu$m to 400 $\mu$m.

As is shown in FIG. 2A, a rigid plate 31 is prepared which has an opening 30 of a size substantially equal to or slightly smaller than that of the aperture 25 of the cavity 16. For example, the rigid plate 31 is made of metal and has a thickness of approximately 10 mm.

As is also shown in FIG. 2A, a shrinkage-reducing sheet 32 containing an inorganic material powder which is not fired in the step of firing the green sheet stack 15 is prepared. The shrinkage-reducing sheet 32 can be formed by a method similar to the above-described method for the shrinkage-reducing sheet 8 shown in FIGS. 1A to 1C, and has a thickness of, for example, 50 $\mu$m to 100 $\mu$ Subsequently, as is similarly shown in FIG. 2A, the rigid plate 31 is placed on the green sheet stack 15 to form a sandwich with the shrinkage-reducing layers 27 and 28, and the shrinkage-reducing sheet 32 is placed thereon.

Next, as shown in FIG. 2B, a step of pressing the green sheet stack 15 in the sheet-stacking direction is performed. In order to perform the pressing step, an elastic member 33 is placed outside the shrinkage-reducing sheet 32, and the green sheet stack 15 is pressed via the elastic member 33. In this pressing step, the elastic member 33 deforms so that the pressing force is exerted onto a bottom surface 34 of the cavity 16 (see FIG. 2A). The elastic member 33 also deforms so that the pressing force is exerted onto a bottom surface 35 (see FIG. 2A) formed on a step portion 35 and a bottom surface 38 (see FIG. 2A) formed on a step portion 37 inside the cavity 16.

As a result, the shrinkage-reducing sheet 32 is cut along the rim which defines the opening 25, the rim of the step portion 35 which defines the opening 19 smaller than the opening 25, and the rim of the step portion 37 which defines the still smaller opening 21. Shrinkage-reducing sheet pieces 39, 40 and 41 which are formed of parts of the shrinkage-reducing sheets 32 are moved so that they are respectively placed on the bottom surfaces 34, 38 and 36.

In the pressing step, the rigid plate 31 acts to allow easy cutting of the shrinkage-reducing sheet 32 along the rim which defines the opening 25. The rigid plate 31 acts on the end face 24 of the green sheet stack 15 via the shrinkage-reducing layer 27, so that the flatness of the end face 24 is ensured.

Where hydrostatic pressing is adopted in such a pressing step, the green sheet stack 15 sandwiched between the shrinkage-reducing layers 27 and 28, the rigid plate 31, the shrinkage-reducing sheet 32 and the elastic member 33 are put into a plastic bag, and are vacuum-packed therein. The vacuum-packed structure including the green sheet stack 15 is put into a tank of a hydrostatic pressing apparatus, and is pressed under, e.g., 500 kgf/cm$^2$ at 60° C.

FIG. 2C shows a state in which the elastic member 33 and the rigid plate 31 have been removed after the pressing step. When the rigid plate 31 is removed, the remaining portion of the shrinkage-reducing sheet 32 other than the shrinkage-reducing sheet pieces 39 to 41 is removed together with the rigid plate 31.

Next, the green sheet stack 15 is fired in the state shown in FIG. 2C. As an example, the green sheet-stack 15 is subjected to a degreasing step at 450° C. for four hours and a main firing step at 900° C. for twenty minutes while not being pressed.

Since the inorganic material powder contained in the shrinkage-reducing layers 27 and 28 is not substantially fired in such a firing step, the shrinkage-reducing layers 27 and 28 are not substantially shrunk. Therefore, the green ceramic sheets 18, 20, 22 and 23 are substantially shrunk only in the thickness direction in the firing step. The shrinkage in the principal-surface direction is restrained by the shrinkage-reducing layers 27 and 28, and is substantially avoided. This makes it possible to reduce undesirable deformation and distortion in a stack which is produced by firing the green sheet stack 15.

Since the inorganic material powder contained in the shrinkage-reducing sheet pieces 39 to 41 is also not substantially fired in the firing step, the shrinkage-reducing sheet pieces 39 to 41 are not substantially shrunk. Therefore, the bottom surfaces 34, 38 and 36 of the cavity 16 with which the shrinkage-reducing sheet pieces 39 to 41 are in contact receive a restraining force from the shrinkage-reducing sheet pieces 39 to 41, and shrinkage thereof is prevented. As a result, flatness can be ensured. The shrinkage-reducing sheet piece 39 on the bottom surface 34 of the cavity 16 also acts to reduce undulations on the bottom surface 34 of the cavity 16.

Next, the shrinkage-reducing sheets 27 and 28 and the shrinkage-reducing sheet pieces 39 to 41 are removed. In this way, a desired multilayered ceramic substrate can be obtained in a proper state by firing the green sheet stack 15.

Figure 3A:
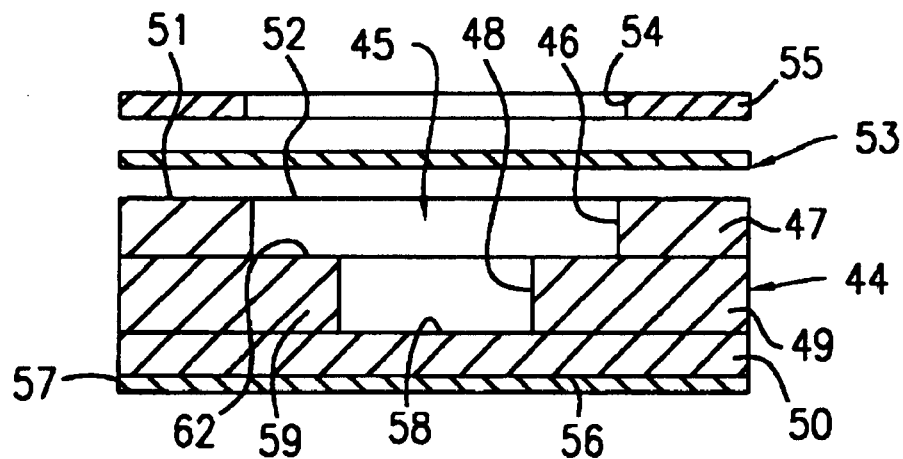
FIGS. 3A and 3B are sectional views sequentially illustrating typical steps included in a multilayered ceramic substrate production method according to a third embodiment of the present invention.
Figure 3B:
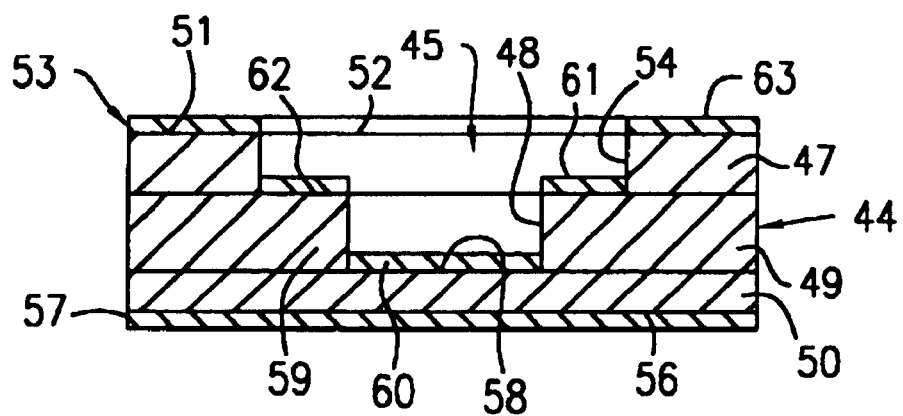

FIGS. 3A and 3B sequentially show typical steps included in a multilayered ceramic substrate production method according to a third embodiment of the present invention. In these figures, the state in which a pressing step is performed is not shown.

The third embodiment shown in FIGS. 3A and 3B also adopts a so-called shrinkage-reducing process in a manner similar to that in the second embodiment shown in FIGS. 2A to 2C, but adopts a different kind of shrinkage-reducing step. Moreover, the number of step portions formed in the cavity is different, which is not an essential difference.

First, a green sheet stack 44 is produced, as shown in FIG. 3A. A first green ceramic sheet 47 having a relatively large opening 46 which constitutes a cavity 45 and a second green ceramic sheet 49 having a relatively small opening 48 which similarly constitutes the cavity 45 are prepared, and a third green ceramic sheet 50 having no opening is also prepared. Each of the green ceramic sheets 47, 49 and 50 may be composed of a plurality of stacked green ceramic sheets. By stacking the first, second and third green ceramic sheets 47, 49 and 50, a green sheet stack 44 having a cavity 45 is produced so that an aperture 52 is positioned on one end face 51 in the sheet-stacking direction of the green sheet stack 44.

As is similarly shown in FIG. 3A, a shrinkage-reducing sheet 53 is prepared. The shrinkage-reducing sheet 53 is obtained by a method substantially similar to that for the above-described shrinkage-reducing sheet 8 or 32, and has a substantially similar composition.

A rigid plate 55 having an opening 54 is prepared. The rigid plate 55 has a structure substantially similar to that of the above-described rigid plate 31.

A shrinkage-reducing layer 57 is placed so as to cover an end face 56 of the green sheet stack 44 opposite from the side where the cavity 45 is formed. The shrinkage-reducing layer 57 serves as a function substantially similar to that of the above-described shrinkage-reducing layer 27 or 28, and has a substantially similar composition.

The green sheet stack 44 is then pressed in the sheet-stacking direction. In this pressing step, the shrinkage-reducing sheet 53 is placed so that it is in contact with the end face 51 of the green sheet stack 44, and the rigid plate 55 is placed thereon.

Although not shown, the green sheet stack 44 is pressed via an elastic member in this pressing step, so that the pressing force is exerted onto a bottom surface 58 of the cavity 45, as shown in FIG. 1B or 2B.

As a result of the above-described pressing force, the shrinkage-reducing sheet 53 is cut along the rim which defines the aperture 52 and the rim of a step portion 59 in the cavity 45 which defines an aperture smaller than the aperture 52. As shown in FIG. 3B, shrinkage-reducing sheet pieces 60 and 61 formed of the cut parts of the shrinkage-reducing sheet 53 are moved so that they are placed on the bottom surface 58 of the cavity 45 and a bottom surface 62 formed on the step portion 59.

A portion 63 of the shrinkage-reducing sheet 53 other than the shrinkage-reducing sheet pieces 60 and 61 remains on the end face 51 of the green sheet stack 44.

The green sheet stack 44 is fired in the state shown in FIG. 3B. In this firing step, the remaining portion 63 of the shrinkage-reducing sheet 53 serves a function substantially similar to that of the shrinkage-reducing layer 27 in the second embodiment shown in FIGS. 2A to 2C, and acts to reduce the shrinkage of the green ceramic sheets 47, 49 and 50 in the principal-surface direction, as well as the shrinkage-reducing layer 57. The flatness of the bottom surface 58 of the cavity 45 and the bottom surface 62 on the step portion 59 are maintained by the shrinkage-reducing sheet pieces 60 and 61.

In the third embodiment shown in FIGS. 3A and 3B, the pressing step may be performed without using the rigid plate 55.

While the present invention has been described with reference to the illustrated embodiments, it is to be understood that the invention is not limited to the disclosed embodiments. On the contrary, the invention is intended to cover various modifications and equivalent arrangements included within the spirit and scope of the invention.

For example, while the green ceramic sheets 4, 23 and 50 do not have an opening which constitutes the cavity in the embodiments shown in FIGS. 1A to 1C to FIGS. 3A and 3B, they may have openings for the cavity which are formed at the positions not corresponding to the openings 22, 17, 19, 21, 46 and 48. In that case, a cavity having an aperture disposed on one end face of the green sheet stack and a cavity having an aperture disposed on the other end face are, for example, formed. The pressing step is performed in a state in which the shrinkage-reducing layers are placed so as to close the apertures of the cavities.

While only the single cavity 1, 16 or 45 is shown in each of the figures, a plurality of cavities may be formed on one end face of one green sheet stack.

As described above, when the green sheet stack having the cavity is fired according to the present invention, since the shrinkage-reducing sheet piece is placed on the bottom surface of the cavity, the green sheet stack can be prevented from shrinking at the bottom surface of the cavity during firing. This can provide a multilayered ceramic substrate having a cavity in which the flatness of the bottom surface is high.

Since the shrinkage-reducing sheet piece does not fill the cavity, it is possible to prevent cracks from occurring on the periphery of the cavity due to the difference in shrinking behavior during firing. This increases the manufacturing yield of multilayered ceramic substrates, and enhances the reliability of wiring on the multilayered ceramic substrates.

The pressing step is performed in a state in which the shrinkage-reducing sheet is placed so as to close the aperture of the cavity and to cover the end face of the green sheet stack in the sheet-stacking direction. The shrinkage-reducing sheet is cut along the rim which defines the aperture of the cavity by a series of pressing forces exerted during the pressing step, and then, the shrinkage-reducing sheet piece which is formed of the cut portion of the shrinkage-reducing sheet is placed on the bottom surface of the cavity. Therefore, the shrinkage-reducing sheet piece can be constantly and properly positioned on the bottom surface of the cavity without performing a special operation for aligning the shrinkage-reducing sheet piece and the cavity. This can simplify the steps and can improve the efficiency.

By pressing the green sheet stack via the elastic member placed outside the shrinkage-reducing sheet, the pressing force can be exerted onto the bottom surface of the cavity. This makes it possible to reliably perform the operations of cutting the shrinkage-reducing sheet and of positioning the shrinkage-reducing sheet piece onto the bottom surface of the cavity.

By performing the pressing step in a state in which the rigid plate having an opening of a size substantially equal to or slightly smaller than that of the aperture of the cavity is placed between the elastic member and the green sheet stack, the flatness of the end face on which the aperture of the green sheet stack is positioned can be reliably maintained during the pressing step.

By placing the rigid plate between the green sheet stack and the shrinkage-reducing sheet, the rigid plate directly acts on the cutting of the shrinkage-reducing sheet during the pressing step, and allows the shrinkage-reducing sheet to be cut easily.

The shrinkage-reducing sheet is placed in contact with the end face in the sheet-stacking direction of the green sheet stack in the step of producing the green sheet stack, and the portion of the shrinkage-reducing sheet remaining after the shrinkage-reducing sheet piece is removed from the shrinkage-reducing sheet remains on the end face in the sheet-stacking direction when the green sheet stack is fired. This makes it possible to reduce the shrinkage of the end face of the green sheet stack during the firing step, and to reliably maintain the flatness of the end face.

In the above-described case, by placing the shrinkage-reducing layer so as to cover an end face of the green sheet stack opposite from the end face where the cavity is formed, the opposite end face can be prevented from being shrunk during firing, and the flatness thereof is ensured. Since the shrinkage of the one end face of the green sheet stack is reduced by the shrinkage-reducing sheet and the shrinkage of the other end face is reduced by the shrinkage-reducing layer, the obtained multilayered ceramic substrate is not prone to uniform deformation. This make it possible to reduce undesirable deformation and distortion in wiring conductors provided in connection with the multilayered ceramic substrate, and to thereby advantageously increase the density of wiring conductors.

The above advantages are similarly achieved in a case in which shrinkage-reducing layers are disposed so as to cover both end faces in the sheet-stacking direction of the green sheet stack when the green sheet stack is produced.

When the shrinkage-reducing layer is provided and when the inorganic material powder contained in the shrinkage-reducing layer and the inorganic material powder contained in the shrinkage-reducing sheet are the same, the number of kinds of materials to be handled when carrying out the multilayered ceramic substrate production method of the present invention can be reduced. This offers cost advantage, and avoids complicate management of the materials.

In the multilayered ceramic substrate to which the present invention is applied, even when the cavity has therein at least one step portion which defines an aperture smaller than the aperture of the cavity, the shrinkage-reducing sheet can be also cut along the rim of the step portion, and the shrinkage-reducing sheet piece can also be placed on the bottom surface formed on the step portion as a result of the step of pressing the green sheet stack. Accordingly, the present invention is particularly advantageously applied to a production method for a multilayered ceramic layer with a cavity which has at least one step portion therein.

When the shrinkage-reducing sheet is subjected beforehand to processing which allows easy cutting at a specific position, for example, perforations are formed therein beforehand, the shrinkage-reducing sheet can be easily cut during the pressing step, and the cut position of the shrinkage-reducing sheet can be stably set.

What is claimed is:

1. A multilayered ceramic substrate production method comprising:

providing a first green ceramic sheet having an opening for forming a cavity having a bottom surface, a second green ceramic sheet having no opening at least at a position corresponding to said opening, and a shrinkage-reducing sheet containing an inorganic material which is not fired at a firing temperature at which the first and second green sheets can be fired;

producing a green sheet stack having a cavity defined by said opening by stacking said first green ceramic sheet and said second green ceramic sheet so that an aperture of said cavity is placed on at least one end face in a sheet-stacking direction of the resulting green sheet stack, and placing said shrinkage-reducing sheet so as to close said aperture of said cavity and to cover said end face in the sheet-stacking direction of said green sheet stack;

pressing said green sheet stack in the sheet-stacking direction so that a pressing force is exerted toward the bottom surface of said cavity, so that said shrinkage-reducing sheet is cut along the rim which defines said aperture of said cavity and so that a shrinkage-reducing sheet piece formed of a part of said shrinkage-reducing sheet is placed on said bottom surface of said cavity; and firing said green sheet stack in a state in which said shrinkage-reducing sheet piece is on said bottom surface of said cavity at a temperature at which a ceramic material contained in said first and second green ceramic sheets is fired and at which the inorganic material in said shrinkage-reducing sheet is not fired.

2. A multilayered ceramic substrate production method according to claim 1, further comprising removing said shrinkage-reducing sheet piece after said firing said green sheet stack.

3. A multilayered ceramic substrate production method according to claim 1, wherein said pressing said green sheet stack comprises pressing said green sheet stack via an elastic member placed outside said shrinkage-reducing sheet.

4. A multilayered ceramic substrate production method according to claim 3, wherein said pressing said green sheet stack further comprises providing a rigid plate having an opening of a size substantially equal to or slightly smaller than that of said aperture of said cavity, and is performed in a state in which said rigid plate is between said elastic member and said green sheet stack.

5. A multilayered ceramic substrate production method according to claim 4, wherein said rigid plate is between said shrinkage-reducing sheet and said elastic member.

6. A multilayered ceramic substrate production method according to claim 4, wherein said rigid plate is between said green sheet stack and said shrinkage-reducing sheet.

7. A multilayered ceramic substrate production method according to claim 1, wherein said shrinkage-reducing sheet is positioned in contact with said end face in the sheet-stacking direction of said green sheet stack during producing said green sheet stack, and wherein said firing said green sheet stack is performed in a state in which a portion of said shrinkage reducing sheet remaining after said shrinkage-reducing sheet piece was removed from said shrinkage-reducing sheet remains on said end face in the sheet-stacking direction of said green sheet stack.

8. A multilayered ceramic substrate production method according to claim 7, wherein said cavity is on only one end face in the sheet-stacking direction of said green sheet stack, and wherein a shrinkage-reducing layer comprising a second inorganic material powder which is not fired at a temperature at which said first and second green ceramic sheets can be fired is positioned so as to cover an end face of said green sheet stack opposite from said end face with said cavity prior to said pressing.

9. A multilayered ceramic substrate production method according to claim 8, wherein said first and second inorganic material powders comprise the same inorganic material.

10. A multilayered ceramic substrate production method according to claim 8, further comprising removing said shrinkage-reducing layer after said firing said green sheet stack.

11. A multilayered ceramic substrate production method according to claim 10, wherein said second inorganic material powder comprises the same inorganic material.

12. A multilayered ceramic substrate production method according to claim 1, further comprising:

placing a shrinkage-reducing layer containing a second inorganic material powder which is not fired at a temperature at which said first and second green ceramic sheets can be fired and having a through portion from which said aperture of said cavity is exposed, so as to cover said end face in the sheet-stacking direction of said green sheet stack.

13. A multilayered ceramic substrate production method according to claim 11, wherein said first and second inorganic material powders comprises the same inorganic material as said inorganic material powder contained in said shrinkage-reducing sheet.

14. A multilayered ceramic substrate production method according to claim 12, further comprising removing said shrinkage-reducing layer after said firing said green sheet stack.

15. A multilayered ceramic substrate production method according to claim 1, wherein said cavity has therein at least one step portion having a bottom surface and a second rim which defines a second aperture which is smaller than said aperture, and wherein said pressing is effect such that said shrinkage-reducing sheet is cut along said second rim of said step portion and a shrinkage-reducing sheet piece is also placed on said bottom surface of said step.

16. A multilayered ceramic substrate production method according to of claim 1, wherein said shrinkage-reducing sheet has an area which is more susceptible to being cut than the remainder of the sheet, whereby a specific portion of said shrinkage-reducing sheet defined by said area can be easily cut.

17. A multilayered ceramic substrate production method according to claim 16, wherein said area comprises perforations.

18. A multilayered ceramic substrate production method according to claim 16, wherein said area comprises a reduced thickness of said shrinkage-reducing sheet relative to the remainder thereof.

19. A multilayered ceramic substrate production method according to claim 1, wherein said first green ceramic sheet has a plurality of openings for forming a plurality of cavities each of which have a bottom surface, said second green ceramic sheet has no openings at least at a position corresponding to said openings, and a green sheet stack having a plurality of cavities defined by said openings is produced by stacking said first green ceramic sheet and said second green ceramic sheet so that an aperture of a plurality of said cavities is placed on at least one end face in a sheet-stacking direction of the resulting green sheet stack, and placing said shrinkage-reducing sheet so as to close said aperture of said plurality of cavities and to cover said end face in the sheet-stacking direction of said green sheet stack.

20. A multilayered ceramic substrate production method according to claim 19, wherein at least one of said plurality of openings is stepped.

* * * * *